(12) United States Patent
Kono

(10) Patent No.: US 8,804,420 B2
(45) Date of Patent: Aug. 12, 2014

(54) SEMICONDUCTOR MEMORY DEVICE

(75) Inventor: Fumihiro Kono, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 251 days.

(21) Appl. No.: 13/458,218

(22) Filed: Apr. 27, 2012

(65) Prior Publication Data

US 2013/0094291 A1   Apr. 18, 2013

(30) Foreign Application Priority Data

Oct. 18, 2011   (JP) .................................. 2011-229211

(51) Int. Cl.
*G11C 16/10* (2006.01)
*G11C 16/04* (2006.01)

(52) U.S. Cl.
USPC .................................. 365/185.03; 365/185.05

(58) Field of Classification Search
None
See application file for complete search history.

(56) References Cited

U.S. PATENT DOCUMENTS

| 7,420,847 | B2 | 9/2008 | Li |
| 7,499,320 | B2 | 3/2009 | Li |
| 7,929,348 | B2 | 4/2011 | Hosono |
| 2010/0135077 | A1* | 6/2010 | Kim et al. .................. 365/185.2 |
| 2011/0032760 | A1 | 2/2011 | Takagiwa |

FOREIGN PATENT DOCUMENTS

| JP | 2000-66950 | 3/2000 |
| JP | 2011-40124 | 2/2011 |

OTHER PUBLICATIONS

U.S. Appl. No. 13/417,503, filed Mar. 12, 2012, Fumihiko Kono, et al.

* cited by examiner

*Primary Examiner* — Hoai V Ho
*Assistant Examiner* — James G Norman
(74) *Attorney, Agent, or Firm* — Oblon, Spivak, McClelland, Maier & Neustadt, L.L.P.

(57) ABSTRACT

At least one of a plurality of columns is an LM column for storing LM flag data indicating a progression state of a write operation. Each of column control circuits performs an LM address scan operation for confirming whether the LM column exists in a corresponding memory core or not. Each of the column control circuits stores a result of that LM address scan operation in a register. In various kinds of operations after the LM address scan operation, each of the column control circuits executes an operation of reading the LM flag data from the LM column in the corresponding one of the memory cores when data retained in the register is first data, and omits executing an operation of reading the LM flag data from the LM column in the corresponding one of the memory cores when data retained in the register is second data.

15 Claims, 6 Drawing Sheets

"1"···LM COLUMN PRESENT
"0"···LM COLUMN ABSENT

SEMICONDUCTOR MEMORY DEVICE

CROSS REFERENCE TO RELATED APPLICATIONS

This application is based on and claims the benefit of priority from prior Japanese Patent Application No. 2011-229211, filed on Oct. 18, 2011, the entire contents of which are incorporated herein by reference.

FIELD

Embodiments described in the present specification relate to a semiconductor memory device.

BACKGROUND

Various forms of nonvolatile semiconductor memory devices for storing data in memory cells in a nonvolatile manner are proposed. Of these various forms, NAND type flash memory is widely used as a data storage device because its storage capacity can be easily enlarged.

To further speed up access, a NAND type flash memory capable of a so-called interleave operation is proposed. An interleave operation is a method of operation in a NAND type flash memory having a plurality of memory cores. Specifically, a method of operation in which an operation in one of memory cores is concealed by, for example, having various kinds of operations being performed in one memory core, while a separate operation (for example, a pre-charge operation) is performed in another memory core, thereby achieving an overall speeding-up of access.

At the same time, a NAND type flash memory sometimes adopts a multilevel storage system in which two bits or more of data are stored in one memory cell. In this case, flag data to indicate to what stage a write operation by the multilevel storage system has progressed (LM flag data) is stored in a certain column of the memory cell array. In a read operation and write operation herein, the LM flag data stored in that LM column is read during read of data from an ordinary memory cell.

DETAILED DESCRIPTION

A semiconductor memory device in an embodiment described be low comprises a memory unit. The memory unit includes a plurality of memory cores divided into a plurality of columns. Each of the memory cores includes bit lines, word lines, and a plurality of memory cells. Each of the memory cells is capable of storing multiple bits of data. A row decoder is configured to select the word lines in the memory core according to an address signal. Column control circuits are configured to control input/output of data to/from the plurality of memory cells via the bit lines. A control circuit is configured to control the row decoder and the column control circuits. At least one of the plurality of columns is an LM column for storing LM flag data indicating a progression state of a write operation of the multiple bits of data. Each of the column control circuits is configured capable of executing an LM address scan operation for confirming whether the LM column exists in a corresponding one of the memory cores or not. Each of the column control circuits stores a result of that LM address scan operation in a register. In various kinds of operations after the LM address scan operation, each of the column control circuits is operative to execute, an operation of reading the LM flag data from the LM column in the corresponding one of the memory cores when data stored in the register is first data, and stop executing an operation of reading the LM flag data from the LM column in the corresponding one of the memory cores when data stored in the register is second data.

Figure 1:
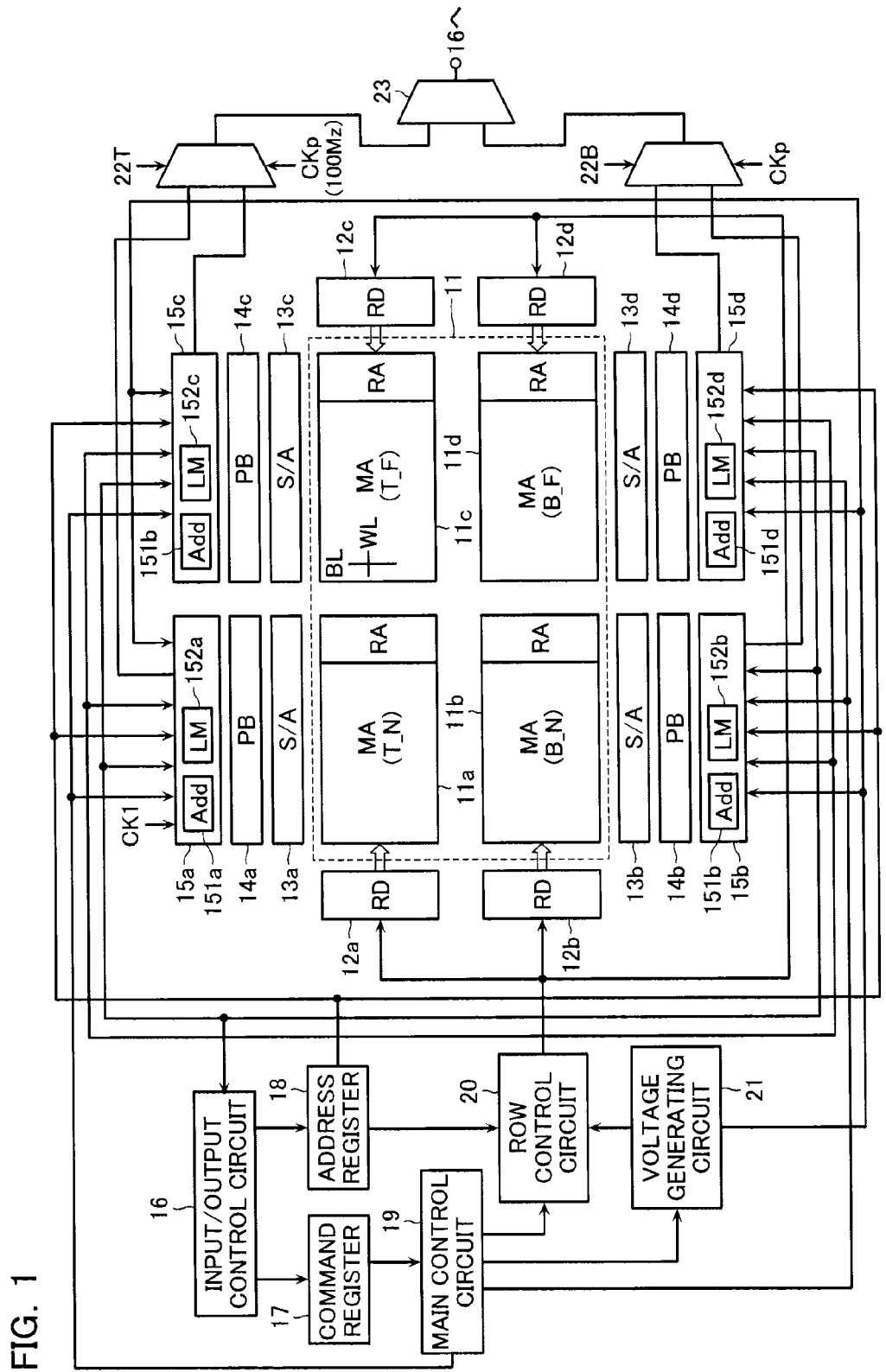
FIG. 1 is a block diagram showing an overall configuration of a semiconductor memory device according to a first embodiment.

The semiconductor memory device according to the present embodiment is described below with reference to the drawings. First, an overall configuration of the semiconductor memory device according to the present embodiment is described with reference to FIG. 1. FIG. 1 is a block diagram of a semiconductor memory device according to an embodiment of the present invention.

As shown in FIG. 1, the semiconductor memory device according to the embodiment comprises a memory unit 11. The memory unit 11 is configured having a plurality of memory cores arranged in a matrix. This FIG. 1 illustrates an example where the memory unit 11 comprises four memory cores 11a-11d.

In addition, this semiconductor memory device comprises row decoders 12a-12d, sense amplifier circuits 13a-13d, page buffers 14a-14d, column control circuits 15a-15d, an input/output control circuit 16, a command register 17, an address register 18, a main control circuit 19, a row control circuit 20, a voltage generating circuit 21, and multiplexers 22T, 22B, and 23.

Figure 2:
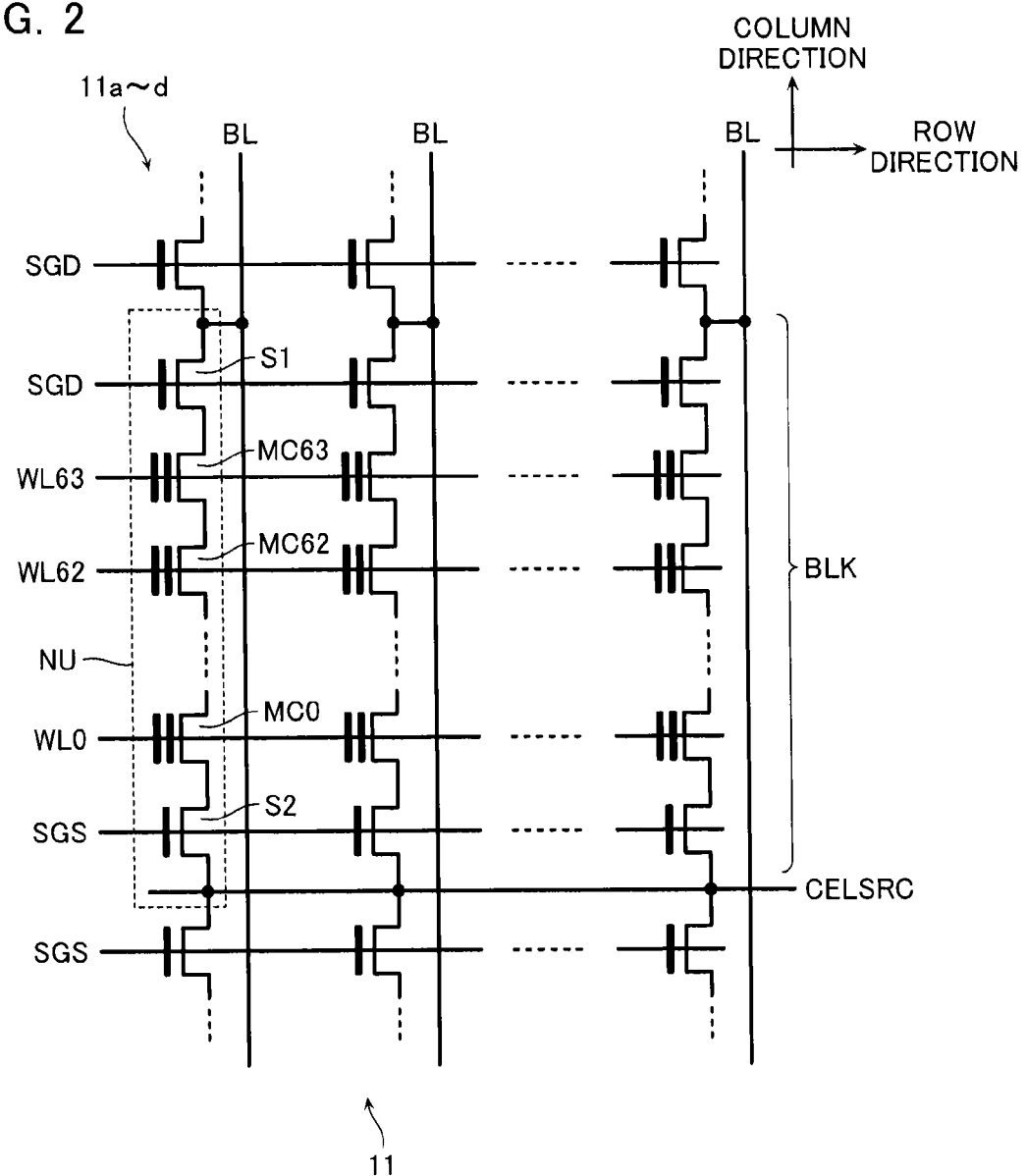
FIG. 2 is an equivalent circuit diagram showing a configuration of a memory cell array MA formed in memory cores 101a-101d.

As shown in FIG. 2, each of the memory cores 11a-11d in the memory unit 11 includes a memory cell array MA configured having NAND cell units NU arranged in a row direction. Each of the NAND cell units NU includes a plurality of (64 in the example of FIG. 2) series-connected electrically rewritable nonvolatile memory cells MC0-MC63 (memory string) and select gate transistors S1 and S2 for connecting the two ends of the memory string to, respectively, bit lines BL and a common source line CELSRC.

As an example, each of the memory cells MC is assumed to have a stacked gate structure in which a gate insulating film, a charge storage layer, an inter-insulating film, and a control gate electrode are stacked on a p-type well formed on a semiconductor substrate.

Control gates of the memory cells MC in the NAND cell unit NU are connected to different word lines WL0-WL63. Gates of the select gate transistors S1 and S2 are connected to select gate lines SGD and SGS, respectively. An assembly of NAND cell units NU sharing one word line configures a block which forms a unit of data erase. As shown in FIG. 2, a plurality of blocks BLK are disposed in a bit line direction. Each of the bit lines BL is connected to the sense amplifier circuits 13a-13d to be described later. The memory cells MC commonly connected to one word line WL configure one page.

Below, the memory cell arrays MA in the memory cores 11a-11d are termed, respectively, memory cell arrays MA(T_N), MA(B_N), MA(T_F), and MA(B_F). T and B refer here to Top side memory core and Bottom side memory core in the memory unit 11. At the same time, N and F refer here to, respectively, Near side and Far side memory cores in the memory unit 11 as viewed from the main control circuit 19. Note that this allocation is (merely) one example, and that allocation may be performed freely, for example, by setting the left side as Near side and the right side as Far side when pad electrodes are set facing downwards.

Note that a portion of each of the memory cores 11a-11d is set as an extra array RA for storing respective column redundancies (defect remedy) or other initial setting data, and so on.

The row decoders 12a-12d are provided corresponding to the respective memory cores 11a-11d. The row decoders 12a-12d decode an address signal and so on inputted via the row control circuit 20 to select word lines in the respective memory cores 11a-11d. However, a format may also be adopted where one row decoder is shared by the memory cores 11a and 11b and one row decoder is shared by the memory cores 11c and 11d.

The sense amplifier circuits 13a-13d detect and amplify a signal read from the bit line BL in the respective memory cores 11a-11d and supply this amplified signal to the respective page buffers 14a-14d. The sense amplifier circuits 13a-13d also provide the bit line BL with a voltage corresponding to write data retained in the respective page buffers 14a-14d.

The page buffers 14a-14d are provided corresponding to the respective memory cores 11a-11d and have a function of temporarily retaining data read from the respective memory cores 11a-11d and temporarily retaining write data supplied from chip external during a write operation.

The column control circuits 15a-15d are provided corresponding to the respective memory cores 11a-11d and decode a column address signal inputted from the address register 18 to perform input/output control such as reading read data to external and supplying write data to the respective page buffers 14a-14d. Note that the column control circuits 15a-15d comprise, respectively, address converting circuits 151a-151d for converting address data (logical address data) provided via the address register 18 from external, into physical address data. Moreover, the column control circuits 15a-15d comprise, respectively, LM column read units 152a-152d for controlling an operation to read an LM column to be described later.

The input/output control circuit 16 transfers data inputted from external to the command register 17, the address register 18 or the column control circuits 15a-15d according to a type of data, and transfers read data acquired by the column control circuits 15a-15d to external. As an example, the address register 18 is supplied with address data AIN from the input/output control circuit 16, and supplies this address data AIN to the row control circuit 20 and the column control circuits 15a-15d. The main control circuit 19 controls the row control circuit 20, the voltage generating circuit 21, and the column control circuits 15a-15d based on command data transmitted from the command register 17.

The row control circuit 20, under control of the main control circuit 19, controls the row decoders 12a-12d based on row address data supplied from the address register 18. The voltage generating circuit 21, under control of the main control circuit 19, generates voltages required in various kinds of operations and supplies these voltages to the row control circuit 20 and the column control circuits 15a-15d.

The multiplexers 22T and 22B operate when executing a read operation by an interleave operation. The multiplexer 22T has a function of integrating and outputting data read alternately from the memory cores 11a (MA(T_N)) and 11c (MA(T_F)) by the interleave operation. The multiplexer 22B has a function of integrating and outputting data read alternately from the memory cores 11b (MA(B_N)) and 11d (MA(B_F)) by the interleave operation. A multiplexer 23 has a function of further integrating the output signals of the multiplexer 22T and 22B to output the integrated signal to the input/output control circuit 16. Note that the multiplexers 22T and 22B operate by a clock signal CK2 of, for example, 100 MHz. This is twice a clock signal CK1 (50 MHz) employed in operation of the memory cores 11a-11d.

Figure 3:
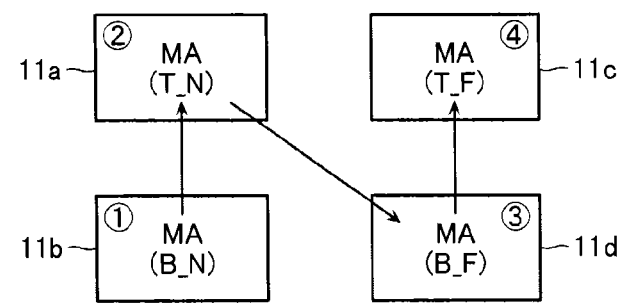
FIG. 3 explains an interleave operation.
Figure 3:
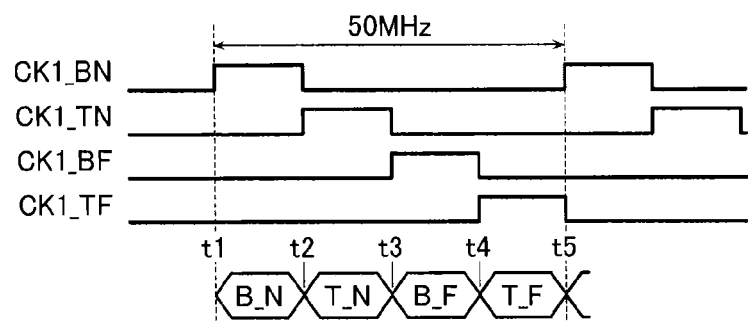

The interleave operation herein is described with reference to FIG. 3. The interleave operation refers to an operation which, for example, while a first operation in a first memory core of the memory cores 11a-11d is executed, a second operation distinct from the first operation in a second memory core distinct from the first memory core is started, and, while the second operation in the first memory core is executed, the first operation in the second memory core is started. For example, as shown in FIG. 3, at time t1 of a rise in a clock signal CK1_BN, a pre-charge operation which is a prior stage of a read operation of the memory core 11b (MA(B_N)) is started. And then, from time t2 when a clock signal CK1_TN rises, the read operation of the memory core 11b (MA(B_N)) is started while at the same time a pre-charge operation in a distinct memory core 11a (MA(T_N)) is started. Similarly thereafter, read operations in the order of memory cores 11b, 11a, 11d, and 11c are executed, while at the same time beginning pre-charge operations in another memory core behind those read operations. Such an interleave operation allows the pre-charge operations to be substantively concealed, whereby operation time can be substantively reduced.

Figure 4A:
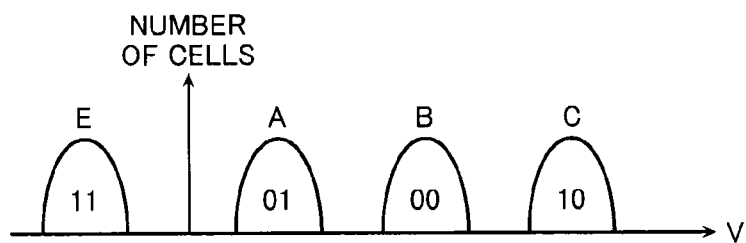
FIGS. 4A and 4B explain a two bits per cell storage system (multilevel storage system).

Next, a relationship between a threshold voltage distribution retained by the above-described memory cell MC and retained data is described. The memory cell MC is assumed capable of retaining, for example, two bits of data corresponding to threshold voltage distributions. FIG. 4A show a relationship between four threshold voltage distributions retainable by the memory cell MC and retained data.

As shown in FIG. 4A, the memory cell MC can retain four data "11", "01", "00", and "10" corresponding to four threshold voltage distributions E, A, B, and C. When data "*#" is written, "*" signifies upper page data and "#" signifies lower page data. Two bits of data stored in one memory cell are expressed by the two data "*" and "#". The threshold voltage distribution E indicates a data erase state and has a lowest threshold voltage level. The threshold voltage level rises in the order of distributions E, A, B, and C. Which of the threshold voltage distributions E, A, B, and C the memory cell MC belongs to can be specified by a widely known read operation.

Figure 4B:
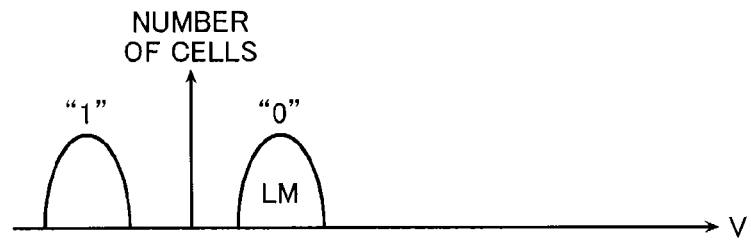

In the case of a multilevel storage system storing multiple bits of data in one memory cell in this way, a write operation is executed divided into a plurality of stages. For example, in the case of a two bits per cell system, the write operation is executed by a procedure starting from a lower page write operation, followed by performing an upper page write operation after completion of the lower page write operation. In this case, it is necessary to know a progression state of the write operation, for example, whether the write operation has been completed to the upper page write operation or whether the write operation has stopped at the lower page write operation, and so on. Therefore, the memory unit 11 is configured capable of storing data indicating such a progression state of the write operation (LM flag data) every page (every one word line WL), the page being a write unit. For example, as shown in FIG. 4B, the LM flag data may be rewritten from "1" to "0" at a stage when lower page write has been completed.

Figure 5:
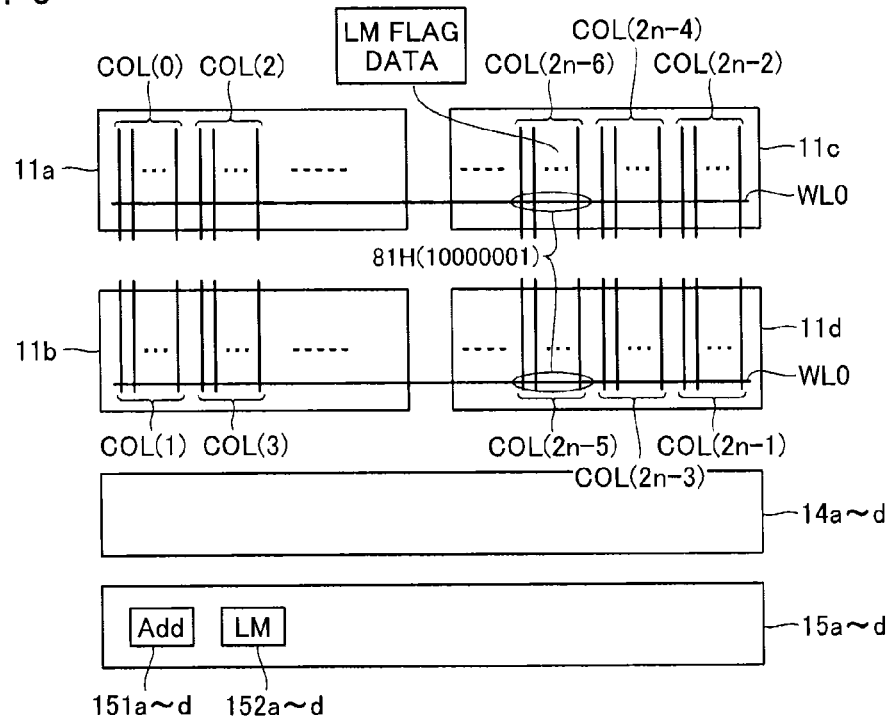
FIG. 5 is a schematic view showing an outline of an LM address scan operation.

As shown in FIG. 5, the LM flag data is stored selectively in any of $2n$ (where n is an integer of 1 or more) column groups COL(0)-COL($2n-1$) in the memory unit 11 (the column group COL in which the LM flag data is stored is referred to below as "LM column COLM"). As an example, the LM column COLM is set to a column COL among the $2n$ column groups COL(0)-COL($2n-1$) that has a physical address ADDPk (for example, physical address 8032) corresponding to a logical address ADDLk (for example, logical address 8032) specified by an initial setting. However, if the column having that physical address ADDPk is a defect column, it may be replaced by well-known redundancy. For example, the LM column COLM is set in a different physical address ADDPk' (for example, physical address 8033), instead of the physical address ADDPk.

In this way, at least one of the $2n$ column groups COL(0)-COL($2n-1$) is set as the LM column COLM. The LM column COLM herein is present in at least one of the memory cores 11a-11d, and the LM flag data is stored in that LM column COLM. Conversely, it may be said that there exist memory cores 11a-11d in which the LM column COLM is not present. In the example of FIG. 5, the LM flag data is stored in the memory cores 11c and 11d (Far side). That is, configuring the memory unit 11 with the memory cores 11a-11d divided into a plurality of columns results in at least one of the memory cores 11a-11d not including the LM column COLM.

In addition, to identify the LM column COLM, a portion of the LM column COLM has memory cells along, for example, the word line WL0 written with an unique data pattern. Now, an example is described where data 81H (10000001) is written as the unique data pattern. This LM column COLM is stored before product shipment based on a result of a die-sort test.

When a device is used by a user after product shipment, the LM flag data is read from this LM column COLM after performing a power-on resetting operation subsequent to power activation and prior to performing the various kinds of operations. Note that when a write operation is performed, the LM flag data is rewritten appropriately according to the progression state of the write operation.

In the power-on resetting operation in this embodiment, each of the column control circuits 15a-15d executes a scan operation (LM address scan operation) for confirming whether the LM column COLM is present in the corresponding memory cores 11a-11d or not and thereby detects the previously mentioned data pattern (81H (10000001)). Detection of the data pattern 81H is performed by a read operation in the word line WL0 where the data pattern is written, and inputting this data pattern to a fail bit detection circuit in the column control circuits 15a-15d.

As a result of the LM address scan, when the data pattern 81H is detected in one of the columns, that column COL where the data pattern 81H is discovered (column groups COL($2n-6$) and COL($2n-5$) in FIG. 5) is set as the LM column. In addition, data "1" is stored in a register (register 1513 described later) provided in the column control circuits 15a-15d corresponding to the memory cores 11a-11d including that LM column. "0" is stored in a register in the column control circuits 11a-11d not having the LM column. It is therefore possible to determine which of the memory cores 11a-11d includes the LM column.

In subsequent various kinds of operations, when data stored in the register is "1", an operation is executed that reads the LM column COLM in the memory cores 11a-11d having the register thereby reading the LM flag data, and when data stored in the register is "0", the operation to read the LM column COLM in the memory cores 11a-11d having the register is not executed. That is, the operation to read the LM flag data of a memory core where no LM flag data exists can be omitted. As a result, power consumption when reading the LM flag can be reduced.

In addition, a column redundancy allows the memory core of the plurality of memory cores in which the LM column is disposed in an initial state to be replaced by a different memory core. This column redundancy operation is controlled by the main control circuit 19. In this case, operation can be speeded up. For example, even if the LM column is moved from the Far side to the Near side, the operation to read the LM flag data in the memory cores 11c and 11d on the Far side where LM flag data does not exist can be omitted. Moreover, the same applies also to when the LM column is moved from the Top side to the Bottom side. Now, in the memory cores 11c and 11d not having the LM column, the operation to search for the LM flag data can be omitted. As a result, unnecessary read of LM flag data can be omitted, hence the operation can be speeded up.

Furthermore, memory cores 11 including the LM flag can be distinguished simply by judging data of the register 1514 without providing a circuit for outputting an address where the LM flag exists. That is, operation of the semiconductor memory device can be speeded up by a simple circuit.

Figure 6:
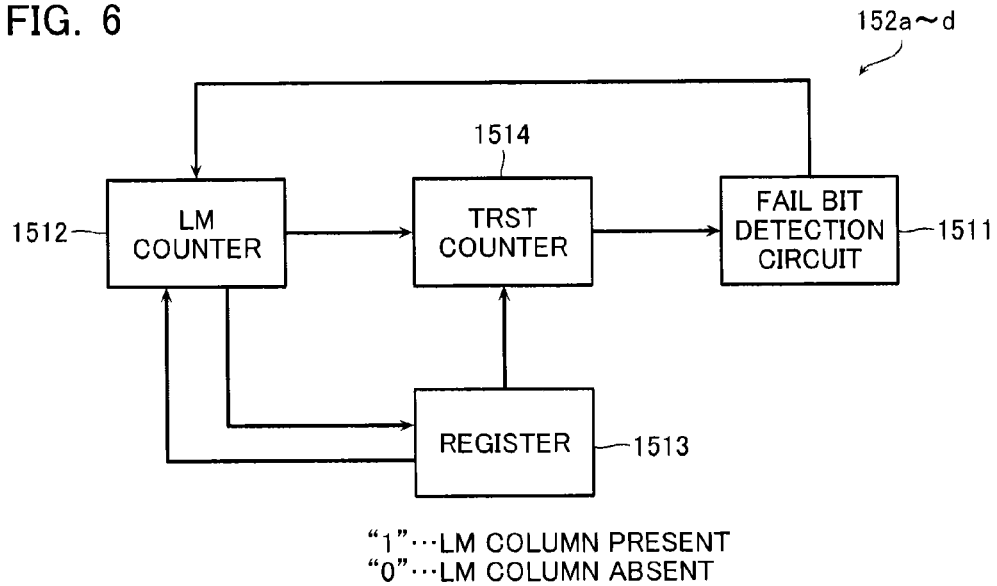
FIG. 6 is a block diagram showing an example of configuration of LM column read units 152a-152d.

FIG. 6 describes an example of configuration of LM column read units 152a-152d. The LM column read units 152a-152d each include a fail bit detection circuit 1511, an LM counter 1512, the register 1513, and a TRST counter 1514. The fail bit detection circuit 1511 is a circuit which, during an ordinary read operation, detects memory cells where write has failed in each of the columns COL based on that read data. The fail bit detection circuit 1511 also has a function of detecting the previously mentioned data pattern (81H) when performing identification of the previously mentioned LM column COLM.

The LM counter 1512 has a function of incrementing a count value every time a column subject to detection is shifted, and stores the count value when the data pattern (81H) is detected. This count value corresponds to the physical address of the LM column COLM. The register 1513 stores data "1" when the data pattern (81H) is discovered and stores data "0" when the data pattern (81H) is not discovered. The TRST counter 1514 has a function of resetting a count value thereof when a read operation or a write operation starts, and thereafter counting up its own count value according to the count value stored in the LM counter 1512 and shifting the fail bit detection circuit 1511 to the LM column accordingly.

Figure 7:
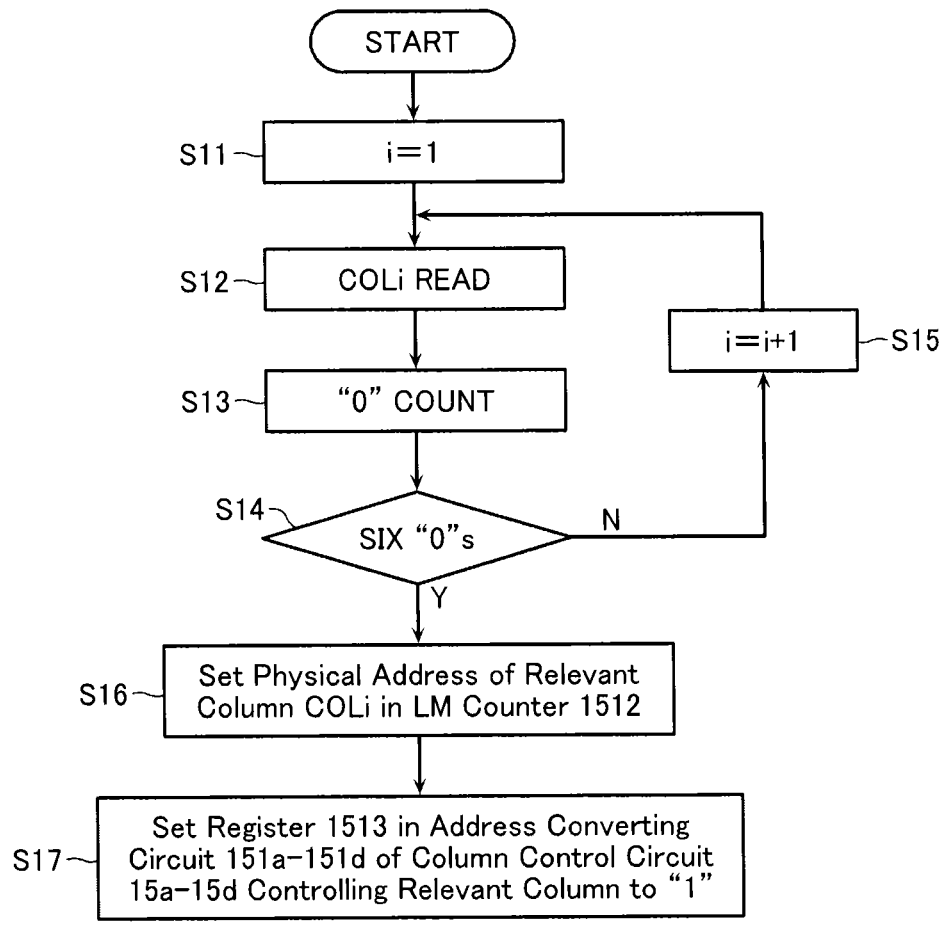
FIG. 7 is a flowchart showing a procedure of the LM address scan operation.
Figure 8:
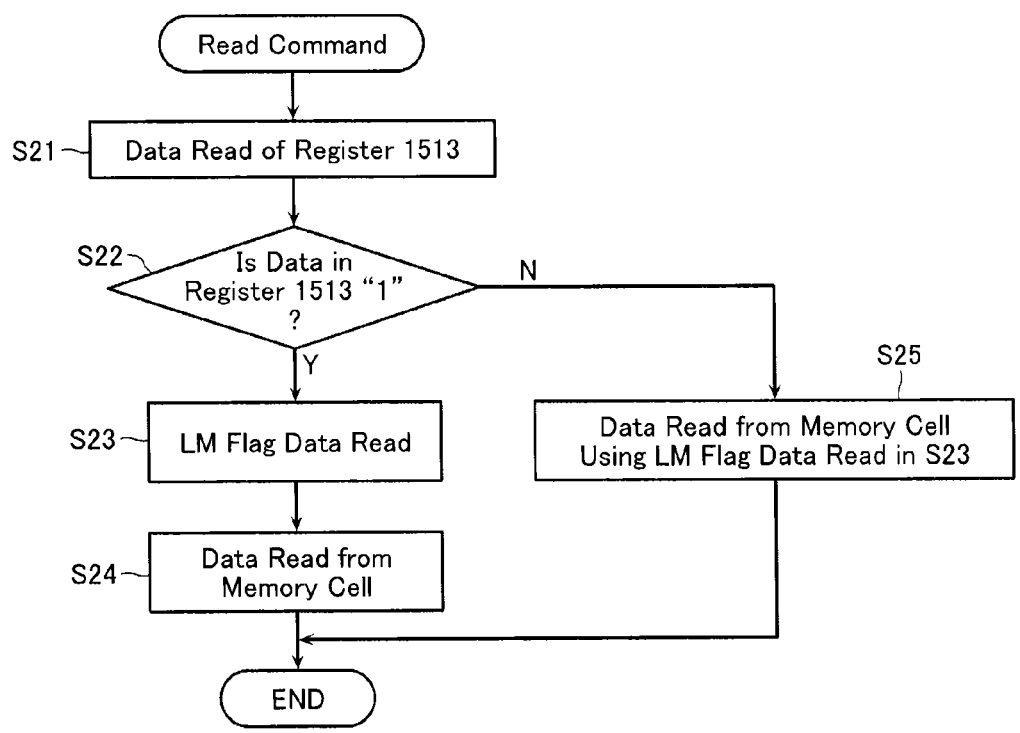
FIG. 8 is a flowchart explaining a read operation subsequent to the LM address scan operation.

Next, operation in the present embodiment is described with reference to the flowcharts in FIGS. 7 and 8. FIG. 7 explains the LM address scan operation in the power-on resetting operation. FIG. 8 explains the read operation subsequent to the LM address scan operation.

The LM address scan operation is described with reference to FIG. 7.

First, a read voltage is applied to the word line WL0 to read data of the memory cell MC where the data pattern (81H) is stored. Then, then columns COL1-COLn are selected sequentially from COL1 or simultaneously (S11), to read sequentially data of each of the columns COL (S12). Then, the read data is downloaded to the fail bit detection circuit

1511, and the number of data "0"s included in that data is counted (S13). If the number of data "0"s has reached the same number 6 as in the data pattern (81H) (Y in S14), that column COL is specified as the LM column COLM. If it has not reached 6, then the procedure shifts to step S12 and the next column COL is read.

When a certain column COLi is specified as the LM column COLM, the physical address of that column COLi is set in the LM counter 1512 (S16). Then, data "1" is set in the register 1513 included in the column control circuits 15a-15d controlling said column COLi. On the other hand, data "0" is set in the register 1513 included in the other column control circuits 15a-15d not including said column COLi (S17). The LM address scan operation is thereby completed.

Operation after the LM address scan operation is described with reference to FIG. 8. Here, a "read operation" for reading data from memory cells is described as an example. When the LM address scan operation and storing of data "1" or "0" in the register 1513 are completed in the power-on resetting operation subsequent to power activation, then a read command is inputted from an external controller or the like. In accordance with this input, the main control circuit 19 performs control to read the corresponding LM flag. In the present example, to perform the interleave operation, the main control circuit 19 gives a command to read four pieces of LM flag data corresponding to read-target memory cells in the memory cores 11a-11d. Note that LM flag data for the memory cores where the LM column COLM is not present is stored in the memory cores where the LM column COLM is present.

First, data in the registers 1513 respectively provided in the column control circuits 15a-15d is read (S21). In the present example, data is read substantially simultaneously from the registers 1513 provided in the four column control circuits 15a-15d. In the memory cores 11a-11d corresponding to the column control circuits 15a-15d where data of the register 1513 is "1", an operation to read the LM flag data from the LM column COLM is executed (Y in S22, and S23). Then, it is judged that to what stage the write operation under the multilevel storage system has finished by the LM flag data, and data is read from the memory cells (S24).

On the other hand, in the column control circuits 15a-15d corresponding to the register 1513 where data "0" is stored, read of the LM column COLM is not performed (N in S22). That is, in the column control circuits 15a-15d corresponding to the register 1513 where data "0" is stored, a read operation using the LM flag data read in S23 is performed (S25). Hence, in the present embodiment, even when the interleave operation as shown in FIG. 3 is performed, the read operation of the LM column is executed only in the column control circuits 15a-15d of the memory cores 11a-11d where the LM column exists, and in the column control circuits 15a-15d other than those where the LM column exists, the read operation of the LM column is not executed. As a result, power consumption can be reduced and improved performance of the device can be achieved.

Note that a write operation due to the multilevel storage system can also be performed similarly by reading the LM flag data. For example, S24 and S25 in FIG. 8 need only be changed to writing data to the memory cells using the LM flag data.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a memory unit including a plurality of memory cores divided into a plurality of columns, each of the memory cores including bit lines, word lines, and a plurality of memory cells, each of the memory cells capable of storing multiple bits of data;
   a row decoder configured to select the word lines in the memory core according to an address signal;
   column control circuits configured to control input/output of data to/from the plurality of memory cells via the bit lines; and
   a control circuit configured to control the row decoder and the column control circuits,
   at least one of the plurality of columns being an LM column for storing LM flag data indicating a progression state of a write operation of the multiple bits of data, and
   each of the column control circuits being configured to execute an LM address scan operation for confirming whether the LM column exists in a corresponding one of the memory cores or not, and then stores a result of the LM address scan operation in a register,
   in various kinds of operations after the LM address scan operation, each of the column control circuits being operative to execute an operation of reading the LM flag data from the LM column in the corresponding one of the memory cores when data stored in the register is first data, and omit executing an operation of reading the LM flag data from the LM column in the corresponding one of the memory cores when data stored in the register is second data.

2. The semiconductor memory device according to claim 1, further comprising:
   a fail bit detection circuit configured to specify the memory cells for which the write operation is incomplete based on data read from a plurality of the memory cells along one of the word lines.

3. The semiconductor memory device according to claim 1, wherein
   the control circuit is configured capable of executing a column redundancy that repositions a column set as the LM column from a first memory core among a plurality of the memory cores to a second memory core distinct from the first memory core.

4. The semiconductor memory device according to claim 1, wherein
   the control circuit is configured capable of executing an interleave operation that alternately executes: an operation which, while executing a first operation on a first memory core of the plurality of memory cores, executes a second operation on a second memory core distinct from the first memory core; and an operation which, while executing the second operation on the first memory core, executes the first operation on the second memory core.

5. The semiconductor memory device according to claim 1, wherein
   the LM column is written with a data pattern for distinguishing the LM column from an ordinary column, and
   the LM address scan operation is an operation for specifying the column where the data pattern is stored.

6. The semiconductor memory device according to claim 5, further comprising:
a fail bit detection circuit configured to specify the memory cells for which the write operation is incomplete based on data read from a plurality of the memory cells along one of the word lines,
wherein the column control circuit detects the data pattern based on an output of the fail bit detection circuit.

7. The semiconductor memory device according to claim 1, wherein
at least one of the plurality of memory cores is a memory core that does not include the LM column.

8. A semiconductor memory device, comprising:
a memory unit including a plurality of memory cores divided into a plurality of columns, each of the memory cores including bit lines, word lines, and a plurality of memory cells, the memory cells capable of storing multiple bits of data;
a row decoder;
column control circuits corresponding to the plurality of memory cores respectively; and
a control circuit configured to control the row decoder and the column control circuits,
at least one of the plurality of columns being an LM column for storing LM flag data indicating a progression state of a write operation of the multiple bits of data, and
the column control circuit being configured to execute an LM address scan operation for detecting the memory cores where existence of the LM column,
after the LM address scan operation, each of the column control circuits being operative to execute an operation of reading the LM flag data only in the memory cores where existence of the LM column.

9. The semiconductor memory device according to claim 8, wherein
the control circuit is configured capable of executing an interleave operation that alternately executes: an operation which, while executing a first operation on a first memory core of the plurality of memory cores, executes a second operation on a second memory core distinct from the first memory core; and an operation which, while executing the second operation on the first memory core, executes the first operation on the second memory core.

10. The semiconductor memory device according to claim 8, wherein
the control circuit is configured capable of executing a column redundancy that repositions the column set as the LM column from a first memory core among a plurality of the memory cores to a second memory core distinct from the first memory core.

11. The semiconductor memory device according to claim 8, wherein
the LM column is written with a data pattern for distinguishing the LM column from an ordinary column, and
the LM address scan operation is an operation for specifying the column where the data pattern is stored.

12. The semiconductor memory device according to claim 11, further comprising:
a fail bit detection circuit configured to specify the memory cells for which the write operation is incomplete based on data read from a plurality of the memory cells along one of the word lines,
wherein the column control circuit detects the data pattern based on an output of the fail bit detection circuit.

13. A method of control in a semiconductor memory device, the semiconductor device comprising a plurality of memory cores divided into a plurality of columns, the method of control comprising:
executing an LM address scan operation that sequentially reads the plurality of columns and detects a first memory core where an LM column exists;
executing an operation of reading LM flag data from the LM column in the first memory core; and
omitting an operation of reading LM flag data from the LM column in another memory core different from the first memory core.

14. The method of control in a semiconductor memory device according to claim 13, wherein
the LM column is written with a data pattern for distinguishing the LM column from an ordinary column, and
the LM address scan operation is an operation for specifying the column where the data pattern is stored.

15. The method of control in a semiconductor memory device according to claim 14, further comprising:
detecting the data pattern based on an output of a fail bit detection circuit for specifying memory cells for which the write operation is incomplete based on data read from a plurality of the memory cells along one of word lines.

* * * * *